United States Patent [19]
Bang et al.

[11] Patent Number: 5,264,375
[45] Date of Patent: Nov. 23, 1993

[54] SUPERCONDUCTING DETECTOR AND METHOD OF MAKING SAME

[75] Inventors: Christopher A. Bang, Cambridge; Markus I. Flik, Boston; Martin A. Schmidt, Reading; Zhoumin Zhang, Cambridge, all of Mass.

[73] Assignee: Massachusetts Institute of Technology, Cambridge, Mass.

[21] Appl. No.: 870,125

[22] Filed: Apr. 15, 1992

[51] Int. Cl.$^5$ .......................................... H01L 31/18
[52] U.S. Cl. ...................... 437/3; 437/927; 148/DIG. 12; 505/701; 505/703
[58] Field of Search .......................................... 505/703

[56] References Cited

U.S. PATENT DOCUMENTS

| | | | |
|---|---|---|---|
| 4,544,441 | 10/1985 | Hartmann et al. | 437/3 |
| 4,696,188 | 9/1987 | Higashi | 73/204 |
| 5,021,663 | 6/1991 | Hornbeck | 250/338.1 |
| 5,043,580 | 8/1991 | Hartemann | 505/849 |
| 5,090,819 | 2/1992 | Kapitulnik | 505/849 |
| 5,122,509 | 6/1992 | Beetz, Jr. et al. | 505/701 |
| 5,173,474 | 12/1992 | Connell et al. | 505/701 |

FOREIGN PATENT DOCUMENTS

| | | |
|---|---|---|
| 3-94127 | 4/1991 | Japan . |
| WO92/01160 | 1/1992 | PCT Int'l Appl. . |
| 2152750A | 8/1985 | United Kingdom . |

OTHER PUBLICATIONS

Kruse, P., "Physics . . . Infrared Detectors", ®1990, pp. 5229–5239.

"High TC Superconducting Infrared Bolometric Detector", B. E. Cole, SPIE vol. 1394, Progress in High-Temperature Superconducting Transistors and Other Devices (1990), pp. 126–138.

"Fabrication and Measurement of High $T_c$ Superconducting Microbolometers", Nahum et al., IEEE Transactions on Magnetics, vol. 27, No. 2, Mar. 1991, pp. 3081–3084.

"Fabrication of an Infrared Bolometer with a High $T_c$ Superconducting Thermometer", Verghese et al., IEEE Transactions on Magnetics, vol. 27, Mar. 1991, pp. 3077–3080.

"Upcoming Planetary Missions and the Applicability of High Temperature Superconductor Bolometers", Brasunas et al., Nasa/Goddard Space Flight Center, Greenbelt, Md., Apr. 1990. NTIS Accession No. N90-27811, pp. 29–30.

"Fabrication of Micro-bolometer on Silicon Substrate by Anisotropic Etching Technique", Shie et al., Technical Digest, Transducers '91, San Francisco, Calif., pp. 627–630, Jun. 1991.

"Superconductivity: A Revolution in Electricity is Taking Shape", R. Dagani, News Focus, May 11, 1987, C&EN, pp. 7–15.

"Formation of Thin Superconducting Films by the Laser Processing Method", Narayan et al., Appl. Phys. Lett. 51(22), Nov. 30, 1987, pp. 1845–1847.

"Feasibility of Infrared Imaging Arrays Using High-$T_c$ Superconducting Bolometers", Verghese et al., J. Appl. Phys. 71(6), Mar. 15, 1992, pp. 2491–2498.

Primary Examiner—George Fourson
Attorney, Agent, or Firm—Hamilton, Brook, Smith & Reynolds

[57] ABSTRACT

A detector useful for detecting infrared (IR) radiation is described which is formed of an epitaxial film of superconductive material having a high transition temperature Tc. Specifically, an oxide of yttrium barium and copper is preferred for the high Tc material. The sensor is formed on a single crystalline silicon body suspended by a silicon nitride membrane over a gap formed in a silicon base body and thermally isolated thereby.

16 Claims, 3 Drawing Sheets

Forming Device Substrate

Forming Base Body

Substrate to Body Bonding

Etchback and Pattern

YBCO Ablation, Metallization

SUPERCONDUCTING DETECTOR AND METHOD OF MAKING SAME

BACKGROUND OF THE INVENTION

This invention relates to superconductive materials and the use of such materials as infrared sensors. Metal-oxide ceramic superconductive materials were discovered circa 1987. Such materials conduct electricity with no resistance at temperatures above the boiling point of liquid nitrogen (77K or −196° C.).

Materials exhibiting this property are called high $T_c$ superconductors, where $T_c$ is the transition temperature at or below which superconductivity is exhibited. A particularly useful high $T_c$, superconductor is a yttrium-barium-copper oxide, such as $YBa_2Cu_3C_x$, where x is 4 to 8 and preferably 7, which has a $T_c$, of 90K or higher.

High $T_c$ superconductors have found many applications in industry, since they can be cooled by Liquid Nitrogen (LN), instead of the awkward and expensive liquid helium used in the past. These applications include, for example, Josephson devices, magnetic detectors formed of superconducting quantum interference devices (SQUIDS) and bolometers.

Bolometers, or radiation sensors, have heretofore been fabricated of high $T_c$ material. (See "High $T_c$ Superconducting Infrared Bolometric Detector", B.E. Cole, *SPIE Vol.* 1394. "Progress in High-Temperature Superconducting Transistors and Other Devices", (1990), pp. 126-138. A bolometer converts absorbed energy to a temperature rise and detects that temperature rise with a thermally sensitive element, such as a resistor The highest bolometer sensitivity is achieved by selecting detector materials with the highest temperature coefficient of resistance (TCR) and low resistivity. Metals have a low TCR in the range of 0.002/° C. to 0.003/° C. at room temperature and a somewhat higher TCR at (LN) temperatures. Semiconductors can have a much higher TCR, but have a very high resistance. High $T_c$ materials have TCRs in the order of 0.5/° C. and the change in resistance at the transition edge is extremely abrupt, making them excellent candidates for bolometric devices.

Another factor of importance in bolometer performance is the thermal properties of the sensor. Both thermal mass and thermal conductance should be minimized within constraints of proper thermal time constant.

From the above, it may be seen that the sensitivity of radiation detectors is limited by the device operating temperature. Presently, room temperature detectors are in wide use while liquid helium devices are reserved for the most demanding applications. For radiation detection in the near IR spectrum, i.e., below about 20 μm, LN detectors offer better performance than room temperature detectors and lower cost than helium-cooled devices LN-cooled detectors for wavelengths longer than 20 μm are presently not available. Infrared detectors detect radiation by either a thermal process or a photon process. In detectors employing a photon process, incident radiation excites a carrier from a valence state into a conduction state. Sensitive semiconductor detectors relying on this process are used to detect near infrared radiation. Photons at longer wavelengths have lower energies and can only excite small energy transitions. But low energy transitions can also be excited by thermal energy. As a result, photon detection devices become much less sensitive at wavelengths beyond 20 microns and are drowned out by thermal energy. Such devices only work well if cooled at liquid helium temperatures The High -Tc detector, however, exhibits high performance at the critical temperature and can be used at longer wavelengths where the photon process detectors (i.e., MCT, photovoltaic, or photoconductive detectors) lose sensitivity.

Accordingly, a need exists for a radiation detector that will provide an LN-cooled alternative for high performance infrared radiation detection at longer wavelengths i.e., in the range of 20 μm or higher.

DISCLOSURE OF THE INVENTION

An improved radiation detector, particularly suitable for IR detection, is comprised of a sensor on a flexible membrane extending over a gap formed in a base body. The membrane is part of a monolithic structure, including an epitaxial silicon device substrate. The membrane is formed as a thin film of $Si_3N_4$ (silicon nitride), which is deposited on the device substrate. The device substrate is then bonded to the base body with the membrane extending over the gap. The bulk of the device substrate is removed leaving only a thin film of epitaxial silicon formed into a device body. The device body is centrally disposed integral with the membrane and adjacent the gap and thermally isolated thereby from the base body.

An epitaxial buffer layer is grown on the silicon device body and a high $T_c$ superconductive epitaxial layer, preferably of $YBa_2Cu_3O_x$ is formed on the buffer layer and patterned into a resistor to form the IR sensor. Contact metallization is then formed on the superconductive layer to complete the detector.

The detector of the invention achieves superior performance with the combination of effective thermal isolation, low thermal capacitance, and a high quality epitaxial superconducting film. From theoretical calculations, it is predicted that an optical noise equivalent power (NEP) of $4 \times 10^{-12}$ W/Hz$^{1/8}$ can be achieved with the detector of the invention, compared with $5 \times 10^{-10}$ W/Hz$^{\frac{1}{2}}$ typical for pyroelectric detectors [Richards, P.L. et al., "Feasibility of the High $T_c$ Superconducting Bolometer ", *Applied Physics Letters*, p. 283, Vol. 54(3)] Responsivity is estimated at 750 V/W. This detector also has a fast response time, due to the low thermal capacitance. The time constant is estimated at 40 μs. For comparison, the high-$T_c$ bolometer reported by Verghese and Richards (Verghese, S. et al., "Fabrication of an Infrared Bolometer with a High $T_c$ Superconducting Thermometer", IEEE Transactions on Magnetics, Vol. 27, p. 3077) achieves an optical NEP of $2.4 \times 10^{-11}$ W/Hz$^{\frac{1}{2}}$, a time constant of 55 ms, and a responsivity of 17 V/W. The microbolometer reported by Nahum, Hu and Richards (Nahum, M. et al., "Fabrication and Measurement of High $T_c$, Superconducting Microbolometers, *IEEE Transactions on Magnetics*, Vol. 27, p. 3081) has a comparable responsivity (478 V/W), and the electrical NEP is $4.5 \times 10^{-12}$ W/Hz$^{\frac{1}{2}}$. The optical NEP, however, is much higher in Nahum et al. because most of the incident radiation is absorbed by the thick substrate. A time constant of 50 μs is calculated from information in Nahum *et als.* report.

DETAILED DESCRIPTION OF THE INVENTION

Figure 1:
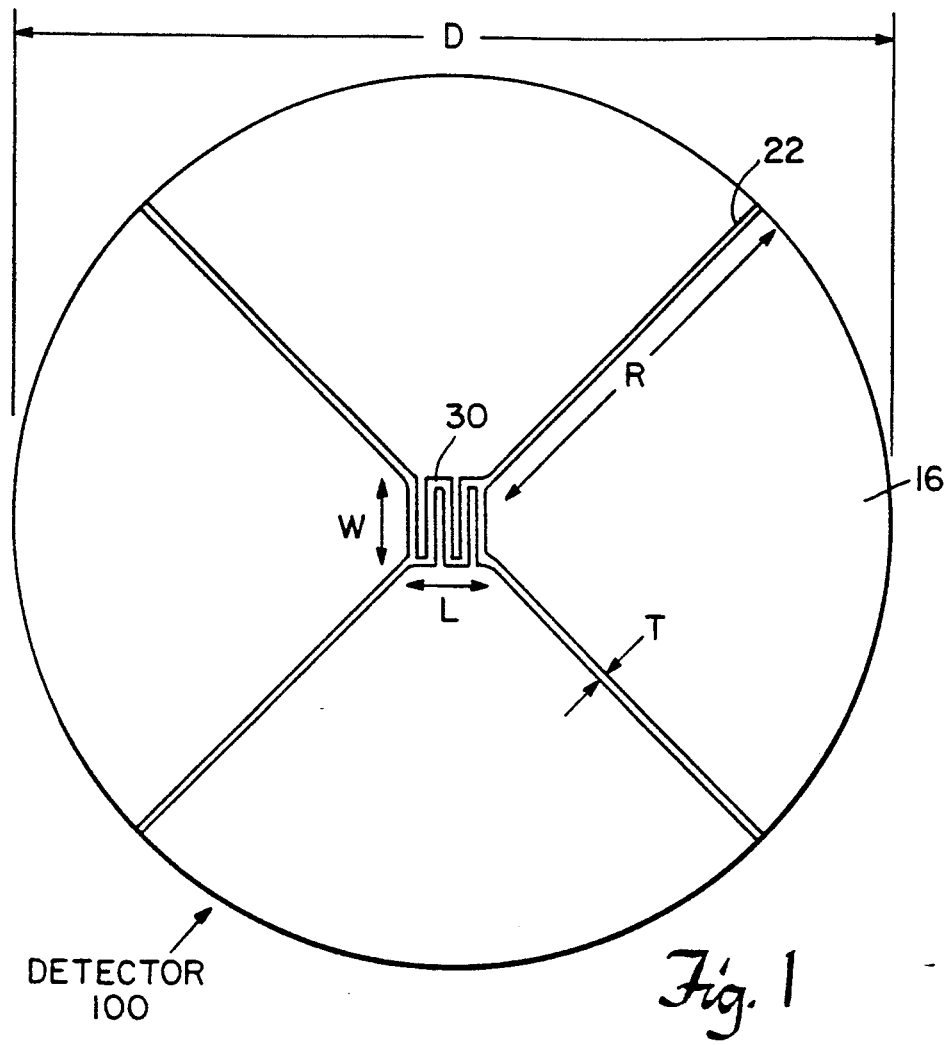
FIG. 1 is a plan view of a preferred embodiment of a detector of the invention.
Figure 2:
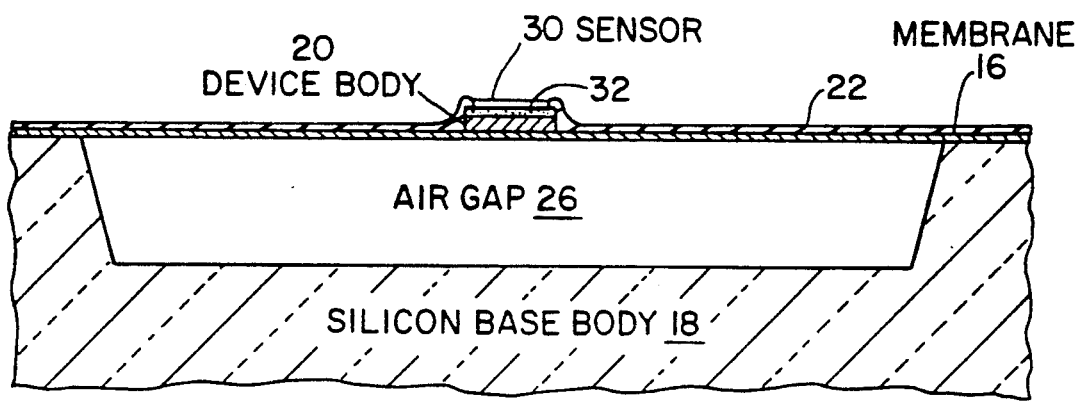
FIG. 2 is an enlarged view of a schematic section through the detector.

Referring now to FIGS. 1 and 2 it may be seen that the detector 100 is comprised of a low thermal capacitance epitaxial silicon device body 20 on which a sensor is formed of a thin film of high Tc material 30, preferably $YBa_2Co_3O_7$, which is epitaxially grown on an optional buffer layer 32 of epitaxial yttria-stabilized zirconia grown on the device body 20. The film 30 is patterned into a convoluted resistor shape to form the sensor. Electrical leads 22 extend from the sensor 30 to the perimeter of the detector 100. The Diameter D of the detector is about 500 microns, the radial length R of the leads 22 is about 215 microns the length L and width W of the sensor 30 is about 50 microns and the thickness T of the leads 22 is about 5 microns. The sensor body 20 is suspended by a thin membrane 16, preferably formed of silicon nitride, across an air gap formed in a Si base body 18. Membrane 16 provides a low thermal conduction path from the device body 20 and isolates the sensor 30 from its environment.

One of the problems overcome by the present invention is finding a way to form an epitaxially grown sensor on a membrane so as to produce a high quality sensor which is thermally isolated. This is made possible by the method described below with the aid of FIGS. 3A-3E.

Figure 3A:
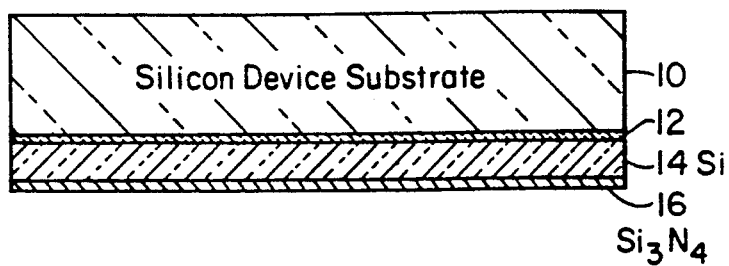
FIGS. 3A-3E is a series of schematic sectional views showing important steps in fabricating the detector of the invention.

A single crystal silicon device substrate 10 is provided. Substrate 10 preferably is doped by in-situ doping of boron atoms during crystal growth to form an etch back layer 12 for subsequent processing leaving a region 14 of epitaxial Si beneath etch back layer 12. A thin film (about 1500Å) of silicon nitride, or other suitable membrane material is deposited on region 14 to form membrane 16. Membrane 16 may be deposited directly on region 14 preferably by Low Pressure Chemical Vapor Deposition (LPCVD) Optionally a stress relief layer of $SiO_2$ (not shown) may be formed in advance of membrane 16 (FIG. 3A).

Figure 3B:
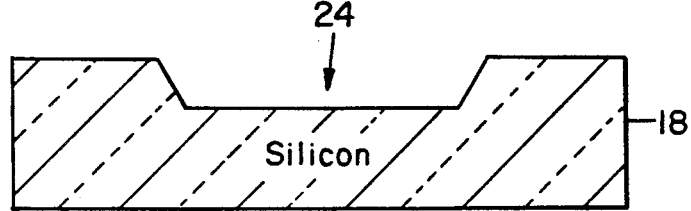

A base body 18 of silicon is also provided. Body 18 is etched using an $SF_6$ plasma or KOH process, as shown, to form a generally concave cavity 24 in an otherwise planar upper surface thereof (FIG. 3B).

Figure 3C:
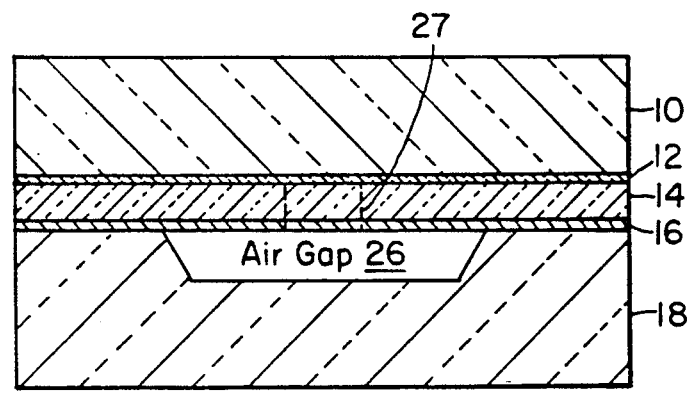
Figure 3D:
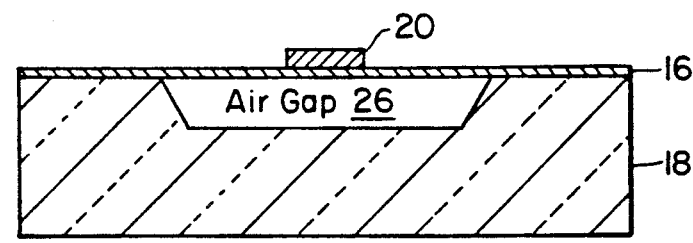

Next, device substrate 120 is bonded to base body so that an air gap 26 is formed beneath membrane 16. In the bonding process, the surfaces of the substrate 10 and base body 18 to be bonded are prepared using a well known standard cleaning procedure developed by RCA, and the surfaces are brought into contact. The contacted hydrated surfaces bond by hydrogen bonding. They simply stick together when placed in contact. The bonded pairs are then annealed in a furnace for one hour. The hydrogen diffuses out, and the elevated temperature causes the two surfaces to chemically bond and fuse together. The anneal is performed at 800°-1100° C. in a N2 gas ambient. A lower temperature, 800° or 900° C. is preferred. Higher temperatures produce a better bond but also reduce the etch-stop layer concentration due to diffusion. (FIG. 3C.)

The bulk of silicon substrate 10 is then removed by etching back the Si material down to the etch back layer 12 using a suitable etchant such as potassium hydroxide (KOH). Layer 12 is also removed by an 8:3:1 solution of acetic acid, nitric acid and hydrofluoric acid. Si material on either side of dotted lines 27 of FIG. 3C is removed down to $Si_3N_4$ membrane 16, using well known photolithography techniques leaving single crystal Si device body 20 integral with membrane 16 and centered over gap 26.

Figure 3E:
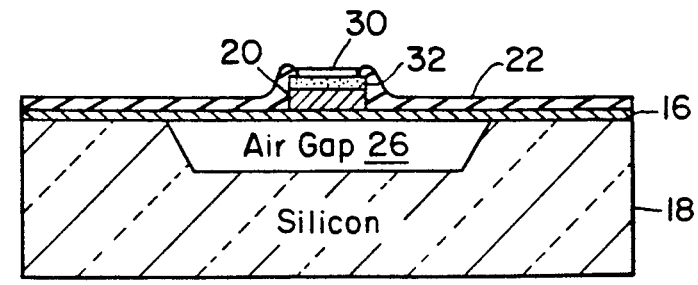

A yttria-stabilized zirconia (YSZ) buffer layer 32, about 700Å thick, is epitaxially grown on the device body 20 preferably by a laser ablation process followed by growth of a $YBa_2Co_3O_7$ (YBCO) film 30, about 500Å thick, likewise by laser ablation. The film 30 is patterned using a weak organic acid, such as EDTA, into a convoluted resistor shape. Ion milling could also be used for patterning. Finally gold is deposited and patterned to provide electrical contact leads 22. (FIG. 3E)

In the laser ablation process, the substrate 10 is placed in a vacuum chamber at 800° C. in an oxygen ambient. The chamber contains targets which are struck and ablated by laser pulses. The ablated material forms the desired thin film on the substrate 10.

The resultant thermal capacitance of the device body 320 is $4 \times 10^{-10}$ J/K and the thermal conductance from the sensor 30 to the base body 18 is estimated at $1 \times 10^{-5}$ W/K during cryogenic operation. The resistance of the sensor 30 is 500 ohms.

Equivalents

This completes the description of the preferred embodiment of the invention. Those skilled in the art will recognize, or be able to ascertain, using no more than routine experimentation many equivalents to the specific embodiments of the invention described herein. These and all other equivalents are intended to be encompassed by the following claims.

Figure 4:
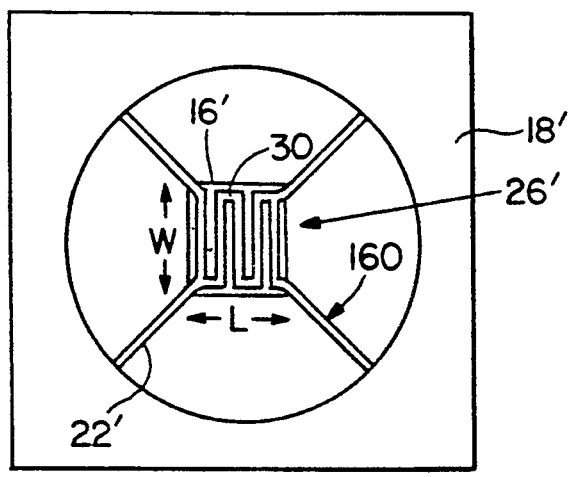
FIG. 4 is a plan view of an alternate embodiment of a smaller device of the invention which is partially cutaway to show the beam struts underlying the gold leads 22'.

For example, the device could be made smaller by patterning the silicon nitride film 16 so that instead of a large area membrane, the detecting element is suspended by a smaller membrane 16' and short silicon nitride beams 160 as in FIG. 4 (as in the Honeywell device reported by Cole supra). This would require the use of silicon-rich silicon nitride, which has lower stress and is more suitable for patterned structures. This may achieve a comparable or better thermal isolation as well as a smaller total device area which is important for array application but requires an additional mask step. Note: FIG. 4 employs like numerals for corresponding items in FIG. 1 with a prime suffix.

Another alternative is to deposit and pattern an absorbing layer (such as gold black) on top of the silicon nitride layer 16 prior to bonding. Then, the finished device would have an absorbing layer underneath the detecting element to improve the absorption and thereby the optical efficiency of the device Adding this process may make bonding more difficult, because the additional process step may degrade the quality of the bonding surface, and bonding would have to be done at a lower temperature in order to protect the absorbing film. Note: electrostatically assisted bonding can be performed at 400° C.

Other materials may be better suited than silicon for use as a substrate for high quality YBCO films (for example, MgO, $LaAlO_3$, or $SrTiO_2$), however, processing techniques for such materials are not as well developed. Note that processing of superconducting films is difficult because the superconducting films are easily degraded, for example, they react with water.

There are different equivalent approaches to patterning the resister sensor 30 from the superconducting film. One approach is to pattern the buffer layer 32 instead of the superconducting layer 30, in which case a superconductor would only be formed over the buffer layer regions. Alternatively, the silicon structure 20 could be patterned into a resistor geometry. If the silicon structure 20 is thick enough and has steep walls, then the superconductor 30 would be isolated from the field and the resistor would be formed without having to pattern the superconductor.

Another alternative embodiment to this process would be the addition of a passivation layer (not shown) to protect the completed device. Such a layer may be necessary for packaging in commercial production, but would add to the thermal conductance.

Finally, since the detector is silicon based, readout electronics can be integrated on the same chip as the sensor.

We claim:

1. A process for forming a radiation detector device comprising the steps of:
   a) forming a cavity on a surface of a base body;
   b) forming a membrane film on a surface of a device substrate;
   c) bonding the substrate to the base body with the membrane film opposite the cavity;
   d) removing material from the device substrate leaving the membrane film and a device body, formed from said device substrate, and aligned with said cavity so that the device body is suspended by said membrane over said gap and thermally insulated thereby from said base body; and
   e) forming said detector device on said device body.

2. The process of claim 1 wherein the device substrate is formed of single crystal material and the detector device is comprised of a sensor formed of epitaxially grown high Tc superconducting material.

3. The process of claim 1 wherein the material is removed by etching and forming an etch back layer in said device substrate to facilitate removal of material to a predetermined depth.

4. The process of claim 2 wherein the superconducting material is an oxide of yttrium, barium, and copper.

5. The process of claim 2 wherein the high Tc superconducting material is grown on an intermediate epitaxial buffer layer.

6. The process of claim 5 wherein the high Tc material is an oxide of Y Ba Cu and the buffer layer is formed of Y stabilized zirconia.

7. A process for forming an IR detector device comprising the steps of:
   a) forming a concave cavity on a planar surface of a silicon base body;
   b) forming a membrane film of a silicon compound on a surface of a single crystal silicon device substrate;
   c) bonding the substrate to the body with the membrane film disposed over the cavity leaving an air gap in the cavity;
   d) etching materials from the device substrate leaving a device body of single crystal silicon suspended by said membrane over said gap and thermally isolated thereby from said base body;
   e) growing an epitaxial buffer layer on said device body;
   f) growing an epitaxial layer of high Tc superconducting material on said buffer layer;
   g) forming said high Tc material layer into a resistor to form an IR sensor; and
   h) forming electrical leads connected to said sensor and extending over said membrane.

8. The process of claim 7 wherein said buffer layer is formed of yttrium stabilized zirconia, and the high Tc material is an oxide of Y Ba Cu.

9. The process of claim 8 wherein the resistance of the sensor is about 500 ohms and the detector has an optical noise equivalent power of about $4 \times 10^{-12}$ $W/Hz^{\frac{1}{2}}$.

10. The process of claim 7 wherein the silicon compound is a nitride of silicon.

11. A process for forming a high Tc superconducting radiation detector device comprising the steps of:
    a) forming a cavity on a planar surface of a base body;
    b) forming a membrane film on a surface of a planar device substrate formed of epitaxial material;
    c) bonding the planar surface of the substrate to the planar surface of the base body with the membrane film disposed opposite the cavity;
    d) removing material from the device substrate leaving the membrane film and a device body, formed from said device substrate, and aligned with said cavity; forming an epitaxial form of high Tc superconductivity material over said device body;
    f) patterning said film into a resistor; and
    g) forming electrical leads to said resistor.

12. The process of claim 11 wherein the device substrate is formed of single crystal silicon material and the high Tc superconducting material is a yttrium-barium-copper oxide.

13. The process of claim 12 wherein an etch back layer of doped silicon is formed in said device substrate to facilitate removal of material to the etch back layer.

14. The process of claim 11 wherein the device substrate is formed of Si and the membrane is formed of a nitride of Si.

15. The process of claim 11 wherein the high Tc superconducting material is grown on an intermediate epitaxial buffer layer.

16. The process of claim 15 wherein the high Tc material is an oxide of Y Ba Cu and the buffer layer is formed of Y stabilized zirconia.

* * * * *

UNITED STATES PATENT AND TRADEMARK OFFICE
CERTIFICATE OF CORRECTION

PATENT NO. : 5,264,375

DATED : November 23, 1993

INVENTOR(S) : Christopher A. Bang, Markus I. Flik, Martin A. Schmidt and Zhoumin Zhang It is certified that error appears in the above-identified patent and that said Letters Patent is hereby corrected as shown below:

Col. 6, line 38, delete "form" and insert --film--.

Signed and Sealed this

Twenty-sixth Day of April, 1994

*Attest:*

BRUCE LEHMAN

*Attesting Officer*     *Commissioner of Patents and Trademarks*